(12) United States Patent
Lipscomb et al.

(10) Patent No.: US 6,969,983 B2
(45) Date of Patent: Nov. 29, 2005

(54) OSCILLOSCOPE MODULE FOR PORTABLE ELECTRONIC DEVICE

(75) Inventors: Edward E. Lipscomb, Lakeville, MN (US); Kurt Raichle, Owantonna, MN (US); Troy Liebl, Owatonna, MN (US); Scott R. Sebastian, Three Rivers, MI (US); Martin P. Franz, Portage, MI (US)

(73) Assignee: SPX Corporation, Charlotte, NC (US)

( * ) Notice: Subject to any disclaimer, the term of this patent is extended or adjusted under 35 U.S.C. 154(b) by 0 days.

(21) Appl. No.: 10/022,573

(22) Filed: Dec. 20, 2001

(65) Prior Publication Data

US 2003/0034767 A1    Feb. 20, 2003

Related U.S. Application Data

(60) Provisional application No. 60/312,476, filed on Aug. 15, 2001.

(51) Int. Cl.$^7$ ............................................. G01R 27/02
(52) U.S. Cl. ...................... 324/76.12; 324/114; 702/66
(58) Field of Search ............................ 324/76.12, 115, 324/114; 361/728; 702/66

(56) References Cited

U.S. PATENT DOCUMENTS

| | | | |
|---|---|---|---|
| 4,034,291 A | * | 7/1977 | Allen et al. .................. 324/115 |
| 5,691,926 A | * | 11/1997 | Cannon et al. ............. 702/122 |
| 5,923,161 A | * | 7/1999 | Frankovitch et al. ....... 324/115 |
| 6,292,717 B1 | * | 9/2001 | Alexander et al. ............ 702/64 |
| 6,543,695 B1 | * | 4/2003 | Hamilton et al. ...... 235/462.43 |

* cited by examiner

*Primary Examiner*—Anjan Deb
*Assistant Examiner*—Timothy J. Dole
(74) *Attorney, Agent, or Firm*—Baker & Hostetler LLP (57) ABSTRACT

An oscilloscope adapter for a portable electronic device includes a hardware interface connector and a computer program memory. The memory stores computer program instructions that direct the electronic device to collect data representative of a signal from an external source and display the data as a waveform comprising individual data values as a function of time. The user may select one or more of the scales of the graph. The adapter also may include one or more of a model waveform database, a collected waveform database, an application-specific database, and a language database.

23 Claims, 6 Drawing Sheets

OSCILLOSCOPE MODULE FOR PORTABLE ELECTRONIC DEVICE

CROSS-REFERENCE TO RELATED APPLICATIONS

This application claims the priority date of U.S. Provisional Patent Application Ser. No. 60/312,476, filed Aug. 15, 2001.

FIELD OF THE INVENTION

The present invention relates generally to oscilloscopes. More particularly, the present invention relates to an adapter device, such as a plug-in module, that allows a portable electronic device to function as an oscilloscope.

BACKGROUND OF THE INVENTION

An oscilloscope is an electronic device used to display and/or analyze the waveform of electronic signals. In its simplest form, an oscilloscope draws a graph of instantaneous signal voltage as a function of time. Typically, the graph displays time from left to right on the horizontal scale, and instantaneous voltage appears typically appears on a vertical scale with positive values going upward, and optionally with negative values going downward from a zero point.

Several types and forms of oscilloscopes have been developed over the years. An early form of oscilloscope, known as a cathode-ray oscilloscope, created a focused electron beam that would move in patterns across the face of a cathode ray tube (CRT) to produce a graph. Today's oscilloscopes typically use a computer processor to generate the graph and display the graph on a liquid crystal or other type of display.

Prior oscilloscopes have traditionally been large in size, often requiring a size similar to that of a suitcase, and a weight that is too great for easy lifting and movement. Such oscilloscopes are not desirable for use in small spaces or in operations where frequent movement of the oscilloscope is required. For example, an oscilloscope may be desired for use as a vehicle engine analyzer, such that secondary ignition waveforms or other patterns can be displayed in graphic form. However, most vehicle service garages have limited space, and many garages have multiple bays. Thus, an oscilloscope that is takes up a large space and/or is cumbersome to move is not desirable.

In addition, prior oscilloscopes have been traditionally stand-alone units. In areas with limited space such as service garages, it is desirable to have a portable and small device that can serve multiple functions. While the prior art has taught that an oscilloscope may be provided with other functionality, such as that of a digital multimeter (DMM) as described in U.S. Pat. No. 4,034,291, to Allen et al., to date general electronic devices have not been provided with add-on oscilloscope functionality.

Accordingly, it is desirable to provide an improved adapter device that enables a portable electronic device to function as an oscilloscope.

SUMMARY OF THE INVENTION

It is therefore a feature and advantage of the present invention to provide an improved adapter device that enables a portable electronic device to function as an oscilloscope.

The above and other features and advantages are achieved through the use of a novel adapter for a portable electronic device as herein disclosed. An oscilloscope adapter for a portable electronic device includes a hardware interface connector and a computer program memory. The memory stores computer program instructions that to direct the electronic device to collecting data representative of an signal from an external source and displaying the data as a waveform comprising individual data values as a function of time. The user may select one or more of the scales of the graph. The adapter also may include one or more of a model waveform database, a collected waveform database, an application-specific database, and a language database.

In accordance with one embodiment of the present invention, an oscilloscope adapter for a portable electronic device, includes a module adapted to interface with a hardware interface port of a portable electronic device having a processor an a display. The module includes a computer program memory, and the memory stores computer program instructions thereon to direct the processor to perform the steps of: (1) collecting data representative of a signal from an external source; and (2) displaying the data on the display as a waveform comprising individual data values as a function of time on a graph having a vertical axis and a horizontal axis, each axis having a scale.

Optionally, the adapter further includes a database of model waveforms, and the instructions further direct the processor to display a model waveform from the database on the display.

Optionally, the adapter further includes a database of collected waveform data, and the instructions further direct the processor to store the data representative of the signal in the database of collected waveform data.

Optionally, the adapter or the electronic device contains a buffer, and the instructions further direct the processor to store the data representative of the signal in the buffer.

Optionally, the instructions further direct the processor to provide an electronic device input that, when activated by a user, allows the user to adjust the scale of one or both of the vertical axis and the horizontal axis. In this embodiment, the electronic device input may allow the user to adjust one or both scales is displayed on the setup screen.

Optionally, the adapter further includes a language database containing data representative of words in a plurality of languages.

In accordance with an alternate embodiment, a method of causing an electronic device to function as an oscilloscope, includes the steps of: (1) connecting an adapter module to a hardware interface port of a portable electronic device having a processor, a display, and a memory; (2) delivering computer program instructions from the module to a processor for the electronic device; (3) collecting, using a plurality of leads connected to the electronic device, data representative of an signal from an external source; and (4) displaying, in response to the computer program instructions, the data on the display as a waveform comprising individual data values as a function of time on a graph having a vertical axis and a horizontal axis, each axis having a scale.

Optionally, in the method embodiment, the adapter further includes a database of mode waveforms, and the method further includes selecting a model waveform from the database and displaying the selected model waveform on the display.

Optionally, in the method embodiment, the adapter further includes a database of collected waveform data, and the method further includes storing the data representative of the signal in the database of collected waveform data.

Optionally, the adapter of the electronic device contains a buffer, and the method further includes storing the data representative of the signal in the buffer. In this embodiment, the method may include the additional step of adjusting the scale of one or both of the vertical axis and the horizontal axis. Optionally, the adjusting step is performed while a setup screen is displayed on the display.

Optionally, the adapter further includes a language database containing data representative of words in a plurality of languages, and the method comprises the additional steps of translating text and displaying the translated text on the display.

In accordance with an alternate embodiment, a plug-in module for a portable electronic device includes a means for interfacing with an electronic device, and a computer program memory. The memory stores computer program instructions thereon to direct a processor to perform the steps of: (1) collecting data representative of an signal from an external source; and (2) displaying the data on a display of the electronic device as a waveform comprising individual data values as a function of time on a graph having a vertical axis and a horizontal axis, each axis having a scale.

There have thus been outlined the more important features of the invention in order that the detailed description thereof that follows may be better understood, and in order that the present contribution to the art may be better appreciated. There are, of course, additional features of the invention that will be described below and which will form at least part of the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract included below, are for the purpose of description and should not be regarded as limiting in any way.

As such, those skilled in the art will appreciate that the concept and objectives, upon which this disclosure is based, may be readily utilized as a basis for the design of other structures, methods and systems for carrying out the several purposes of the present invention. It is important, therefore, that the claims be regarded as including such equivalent constructions insofar as they do not depart from the spirit and scope of the present invention.

DETAILED DESCRIPTION OF PREFERRED EMBODIMENTS OF THE INVENTION

A preferred embodiment of the present invention comprises an improved adapter device that provides processing, storage, and/or program instructions for enabling a portable electronic device to function as an oscilloscope. Preferably, the device is an add-on adapter, such as a plug-in module, that serves as an add-on oscilloscope for a portable, and preferably hand-held, electronic device, such as a portable computer, pocket PC, personal digital assistant, analog or digital analyzer, electronic game, or other electronic device. The module includes a memory or other carrier storing program instructions for adding functionality to the electronic apparatus, or the module may include hardware to accept a computer memory containing computer program instructions and deliver such instructions to the electronic device and/or to add processing capability to the device.

Figure 1:
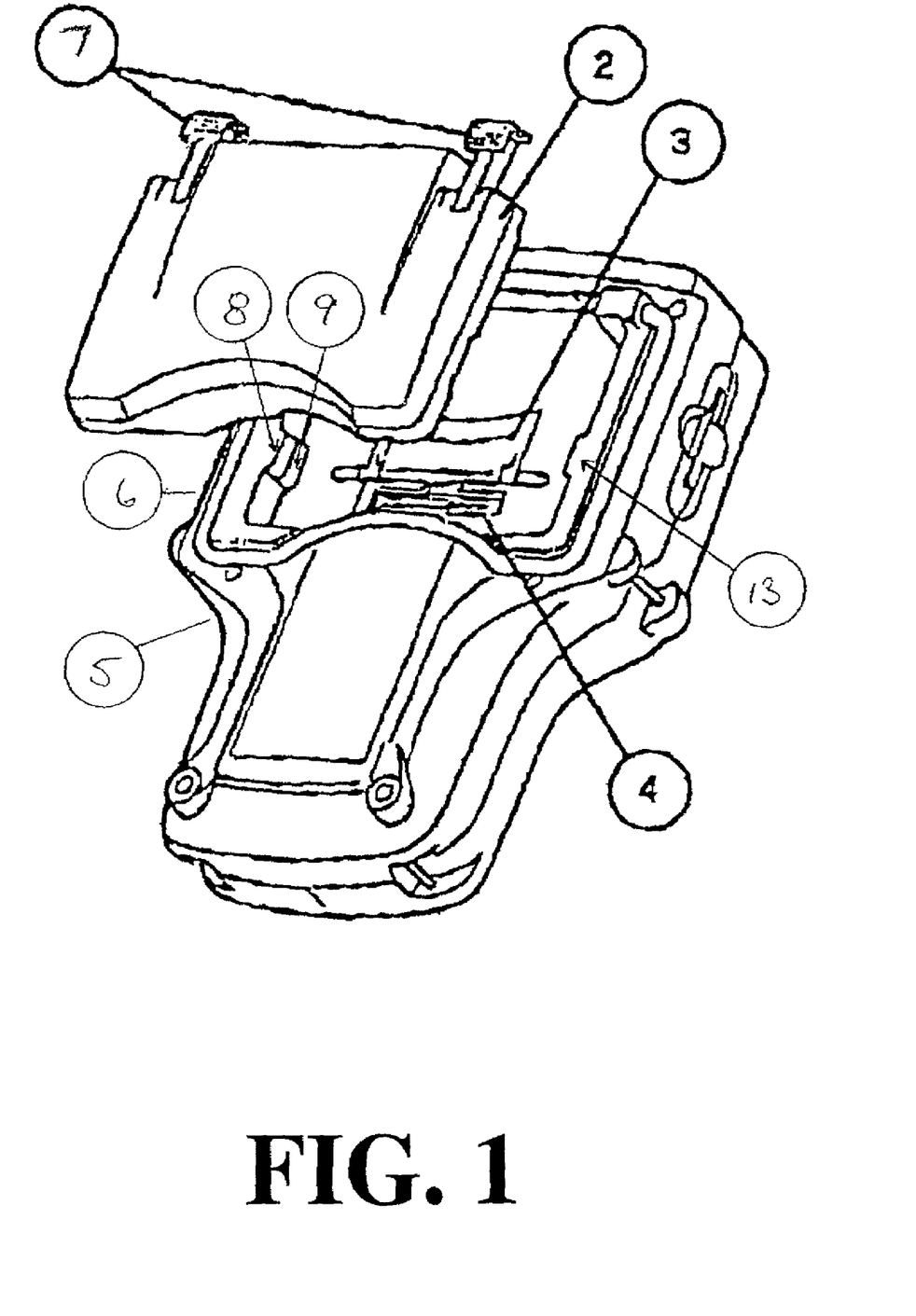
FIG. 1 illustrates an exemplary embodiment of a portable electronic device that can be used with the present inventive adapter.

FIG. 1 illustrates an exemplary embodiment of a portable electronic device that can be used with the present inventive adapter. Referring to FIG. 1, a portable electronic device 5 includes a module port 6 that may accept a module such as a plug-in module 2. At least one such electronic device is described on page 6–8 and the accompanying drawings in co-pending U.S. patent application Ser. No. 90/702,750, entitled"Plug-In Module for Portable Computing Device," which is hereby incorporated herein by reference.

Returning to FIG. 1, the portable electronic device preferably includes a hardware interface port 4 such as a 120-pin or 120-receptacle connector to provide an interface between the plug-in module and the electronic device. A rotateable door 3 is shown for covering the hardware interface 4. The adapter module 2 mates with the hardware interface port 4 of the electronic device via a hardware interface connector that is included with the adapter module. The adapter module 2 and/or the device 5 preferably includes a means to secure the module 2 to the device 5. For example, FIG. 1 illustrates that one or more latches 7 may be provided to secure the module 2 to the electronic device 5 during normal operation. Additionally, the module port 6 includes one or more extensions such as 8 and 13 that form grooves or notches such as 9 within the port.

The electronic device illustrated in FIG. 1 is a portable engine analyzer, such as that which may be used to measure and analyze various aspects of the operation of a vehicle. However, the electronic device may in fact be any type of analyzer or other type of portable electronic or computing device such as a pocket PC or a personal digital assistant, a remote control, an electronic game, or any other portable electronic device. In the embodiment of an engine analyzer, the analyzer may serve to collect and analyze multiple aspects of an engine or vehicle, including aspects of the vehicle operations such as emissions components, system pressure, fluid pressure, system temperature, and other aspects or conditions. However, the analyzer or other electronic device may be equipped with additional functionality.

Figure 2:
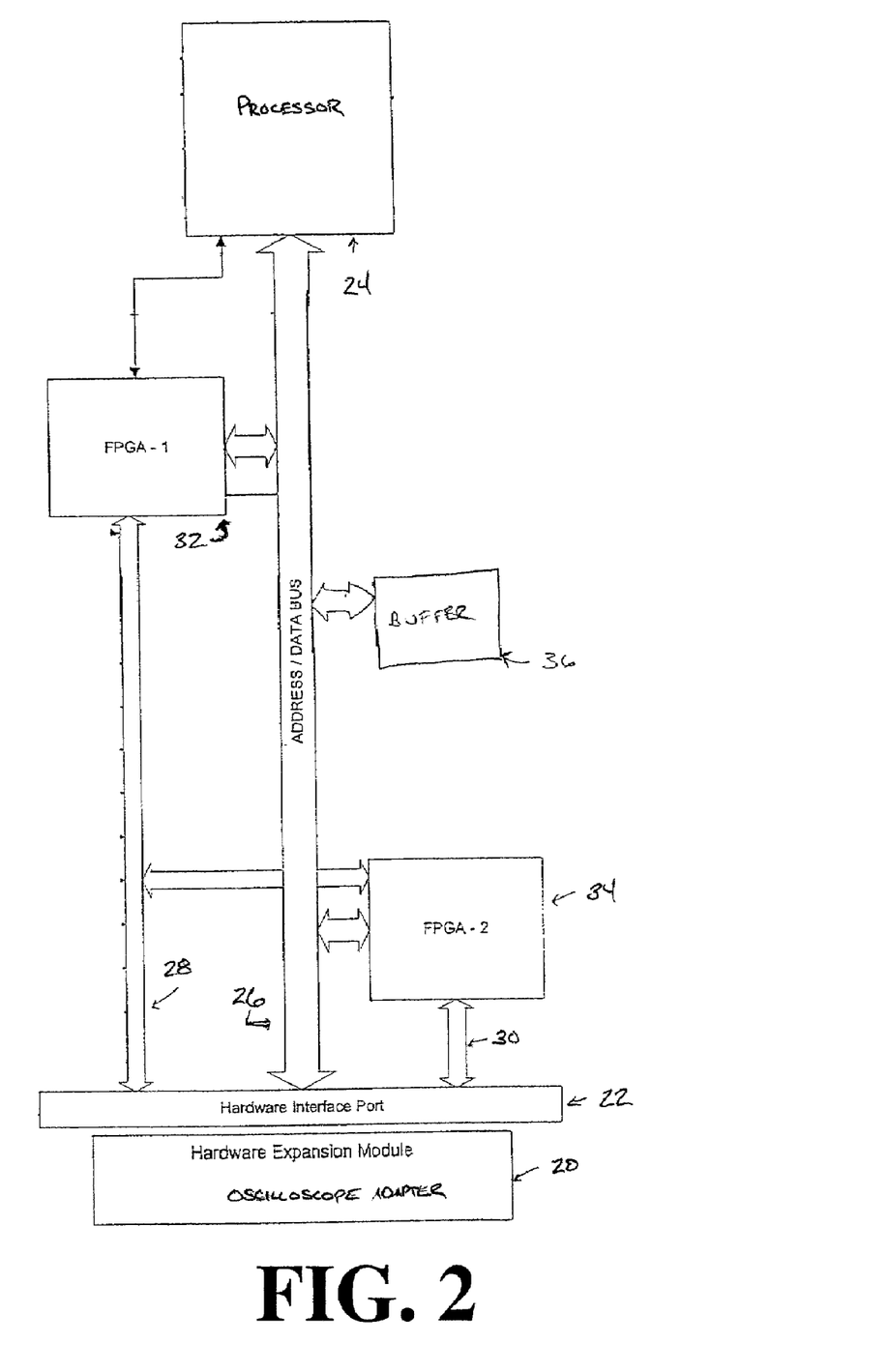
FIG. 2 is a block diagram illustrating the exemplary hardware of an electronic device with which the present inventive module may interface.

FIG. 2 illustrates the internal components of an exemplary electronic device. Such components may interface with the module through the hardware interface port. Referring to FIG 2, a hardware interface connector of an exemplary oscilloscope adapter module 20 interfaces with a hardware interface port 22. Certain pins or receptacles on the hardware interface port 22 provide communication to and from a controller 24 via interface bus 26 within the portable electronic device. The hardware interface port 22 may also serve to communicate discrete input/output signals via interface bus 26 to the oscilloscope module through the hardware interface connector 20, and the oscilloscope module 20 may share input/output signals 28 and/or 30 with one or more field programmable gate array (FPGA) components within the electronic device such as 32 and/or 34. The device may also include a memory or buffer 36 that stores data collected by the device.

To provide an oscilloscope adapter module for an electronic device, the module may include a computer program memory or other carrier, such as a floppy disc, a CD-ROM, a virtual memory, or a signal, containing computer program instructions that instruct the electronic apparatus to perform such functions. These instructions are preferably loaded into the electronic device when the oscilloscope application is selected. Optionally, the module may also provide processing hardware that can be used by the electronic device when performing such functions.

Preferably, the module includes a custom-programmed FPGA or other circuitry to provide some or all processing functions, such as timing, sampling, and/or analog-to-digital converter functions. Such memory, circuitry, and/or processing hardware may be included in the module itself, or optionally the module may simply contain communications hardware that provides an interface between the hardware interface port of the portable electronic device and an external memory or processor.

Program instructions contained in the module instruct the display of the electronic device to display alternating current (AC) and/or pulsating direct current (DC) waveforms of varying frequencies, such as frequencies as low as approximately 1 hertz (Hz), or as high as several megahertz (MHz), several gigahertz (GHz), or more.

Figure 3:
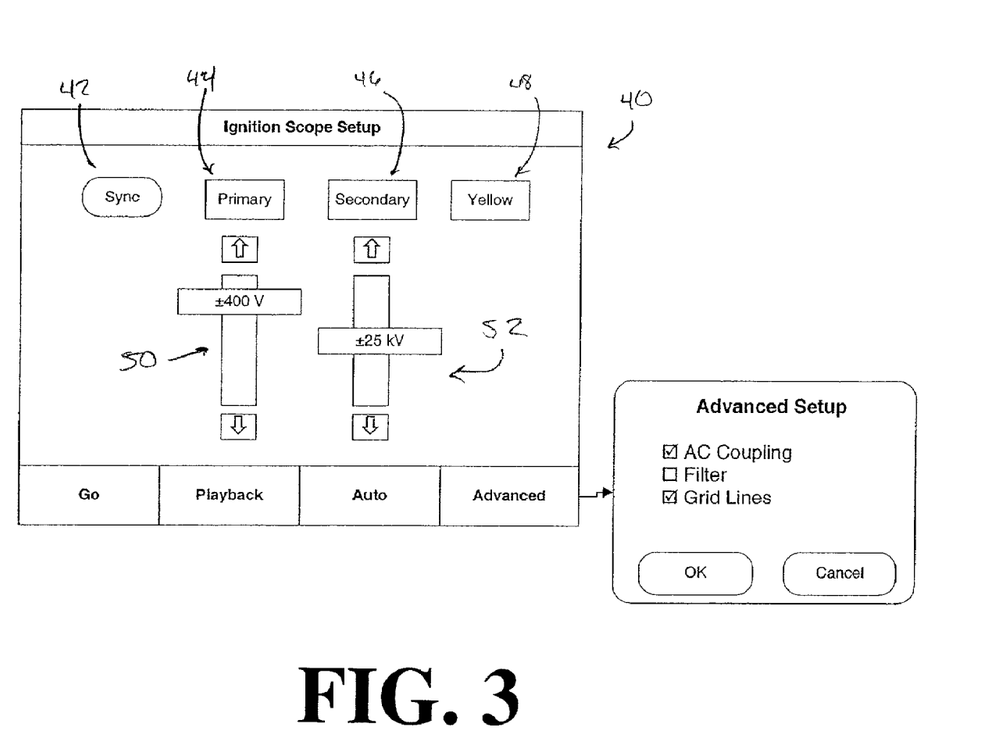
FIG. 3 illustrates an exemplary embodiment of a setup screen that may appear on the display of an electronic device when used with the present inventive oscilloscope adapter module.

FIG. 3 illustrates an exemplary embodiment of a setup screen 40 that may appear on the display of an electronic device when used with the present inventive oscilloscope adapter module. As illustrated in FIG. 3, the electronic device will be equipped with at least three inputs for an oscilloscope adapter module, or at least four inputs in an alternate embodiment comprising either a DMM adapter module or a combined oscilloscope/DMM adapter module. These inputs will collect data from the thing to be analyzed, such as an automobile engine, and deliver the data to the electronic device and/or the adapter module through corresponding input channels. These channels are identified on display screen 10 as 42, 22, 46, and 48. For an oscilloscope adapter module, the channels preferably correspond to typical oscilloscope inputs such as a primary waveform input 44, a secondary waveform input 46, and a synchronization input 48 42. Data collected by each input as analog signals are converted, using analog-to-digital conversion circuitry located in either the electronic device or the adapter, to a digital format and displayed as a waveform on the display of the electronic device.

As illustrated in FIG. 3, an optional and preferable setup function allows the user to select the scale associated with the waveforms through an input such as a sliding scale 50 and 52 or some other input such as a knob, a pushbutton, a keypad, or a numeric selector. Preferably, pre-set oscilloscope configurations are provided, such as pre-set scales, to make setup simpler.

Figure 4A:
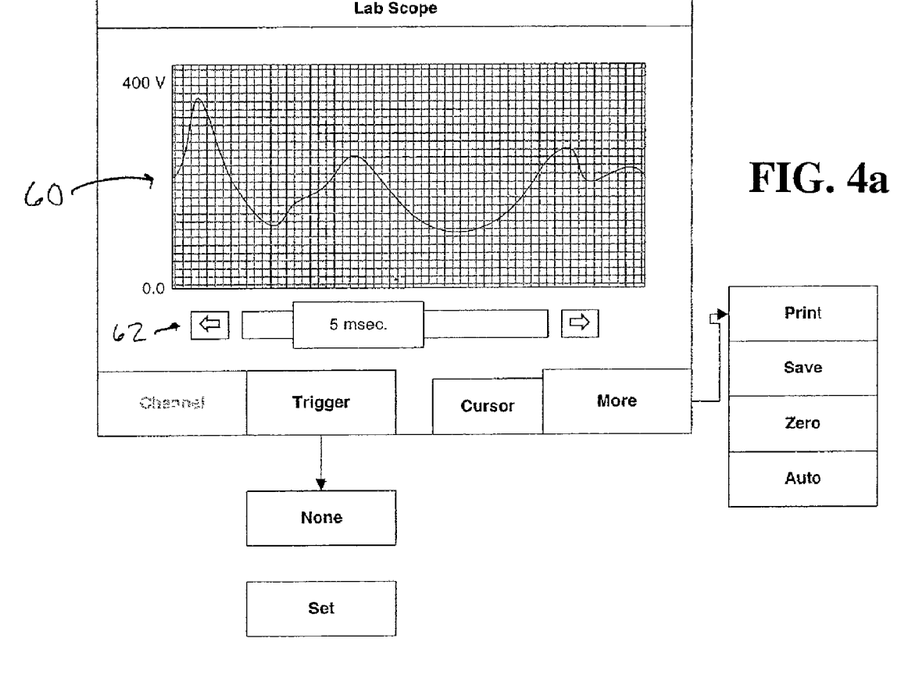
FIGS. 4a and 4b illustrate exemplary display screens in which the adapter module provides for display of the input signal as a waveform.
Figure 4B:
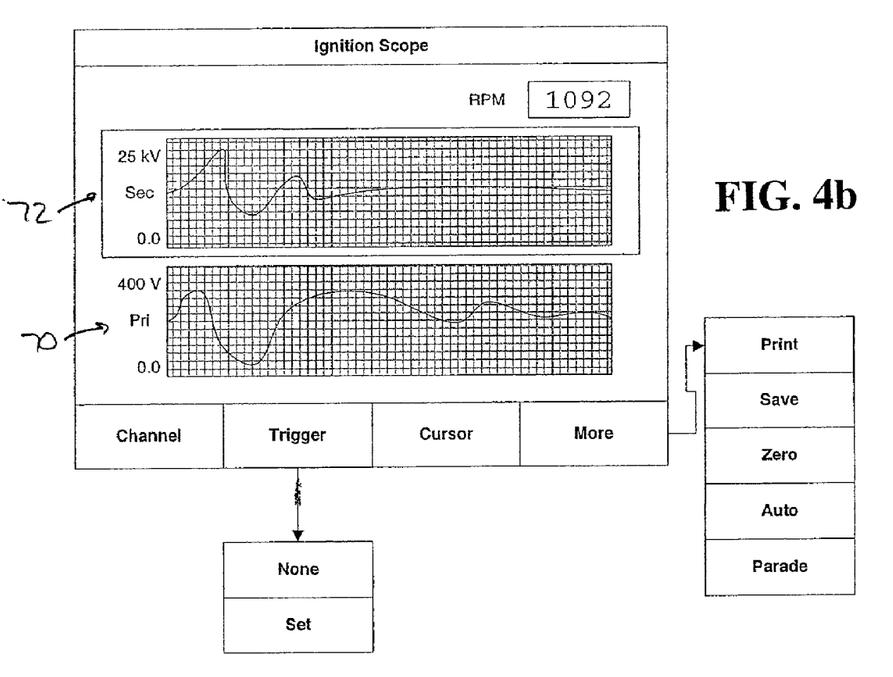

FIGS. 4a and 4b illustrate exemplary display screens in which the adapter module provides for display of the input signal as a waveform. For example, referring to FIG. 4a, an input voltage signal 60 is displayed over time, with the voltage appearing on the x-axis of the display and the time appearing on the y-axis of the display. Optionally, the user may be provided the option to adjust one or more of the scales of either axis. For example, FIG. 4a illustrates that the user may be provided the ability to adjust the time scale on a sliding scale 62.

FIG. 4b illustrates that multiple waveforms may be displayed on a single screen. For example, a primary waveform 70 and a secondary waveform 72 may be displayed at the same time. The waveforms may be "live" waveforms, based on real-time collection of data, or one or both of the waveforms may be based on data previously collected and stored in the memory unit of the adapter module. For example, the adapter module may be programmed to include a database of previously collected signal data and/or data representative of predetermined conditions (such as optimal waveforms), and the user may compare a real-time waveform with one or more of the stored waveforms to help diagnose problems or other circumstances relating to the item that is being analyzed. An optional manual mode may allow the user to set up the scope for sensors and signals that are not contained in the waveform database.

Figure 5:
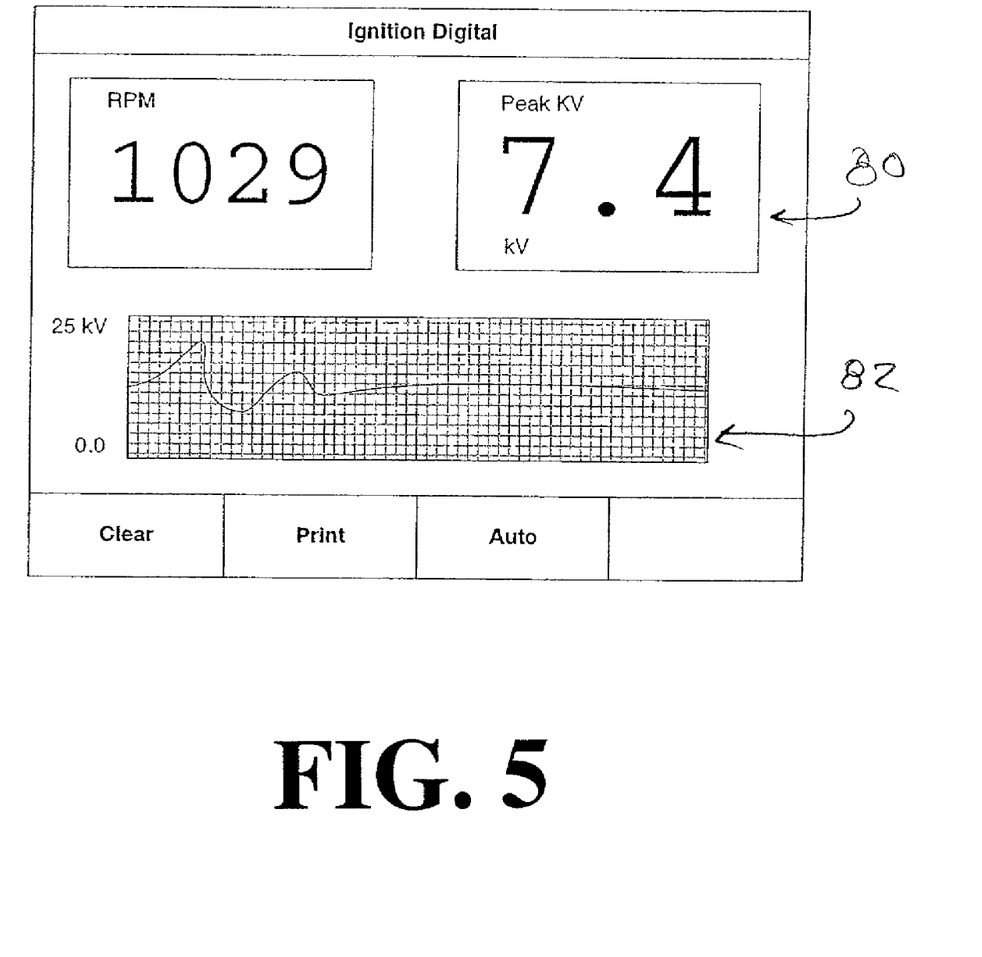
FIG. 5 illustrates an embodiment where the adapter module provides both oscilloscope and DMM functionality.

Optionally, other functions provided by the adapter may be displayed, either by themselves or along with the waveform. For example, as illustrated in FIG. 5, in an embodiment where the adapter module provides both oscilloscope and DMM functionality, the screen may display input signals in both DMM 80 and oscilloscope 82 format.

Depending on the design of the electronic device, the user inputs, such as scale selection, may be performed through buttons, knobs, or other inputs located on the electronic device. Alternatively, in the case where the device is equipped with a touch-sensitive screen, such as with a personal digital assistant, the inputs may be performed by touching an appropriate area of the screen. For example, referring to FIG. 4a, a sliding scale 62 may be included with one or more arrows, and the user may adjust the scale by touching the arrows and/or the slider on the screen.

Optionally and preferably, the adapter module is programmed to provide glitch detection, i.e., to detect abnormalities in the signal and alert the user that such abnormalities have been detected.

When used in connection with a portable electronic engine analyzer, the module and analyzer may be used to diagnose problems with vehicle systems such as automotive engines. In a apparatus of this type, the analyzer, or optionally the module, includes several leads or test probes that a mechanic or other technician may attach to various components of a vehicle. The analyzer will use these probes to gather various types of information while the mechanic or technician performs certain actions such as maintaining the engine under load or starting the engine. The results of such tests, and knowledge about the vehicle or engine type, trouble symptoms, allowable limits, and other data, can lead to a diagnosis of a problem. Diagnosis usually points to some corrective action such as the replacement of parts or the performance of system adjustments by the mechanic.

When used in connection with a portable electronic engine analyzer, the module and analyzer may be used to diagnose problems with vehicle systems such as automotive engines. In a apparatus of this type, the analyzer, or optionally the module, includes several leads or test probes that a mechanic or other technician may attach to various components of a vehicle. The analyzer will use these probes to gather various types of information while the mechanic or technician performs certain actions such as maintaining the engine under load or starting the engine. The results of such tests, and knowledge about the vehicle or engine type, trouble symptoms, allowable limits, and other data, can lead to a diagnosis of a problem. Diagnosis usually points to some corrective action such as the replacement of parts or the performance of system adjustments by the mechanic.

Preferably, the mechanic may use the module and analyzer in accordance with at least three modes: (1) a data capture mode, which provides for collection of measurements or other data by the analyzer; (2) a display mode, which allows the user to visualize the data in one of several formats such as a graphic waveform; and (3) optional recording and/or sharing modes that allow the user to record and/or share events of interest with the vehicle's owner, other mechanics, or others. Such recording may take place in the adapter module's storage unit, or the analyzer and/or module may deliver the data to a remote location, whether by a direct connection, a wireless connection, or a network such as the Internet or an intranet, for storage. The oscilloscope adapter module provides the electronic device with the display mode capability, and it may optionally also provide or enhance the data capture functions of the electronic device.

Figure 6:
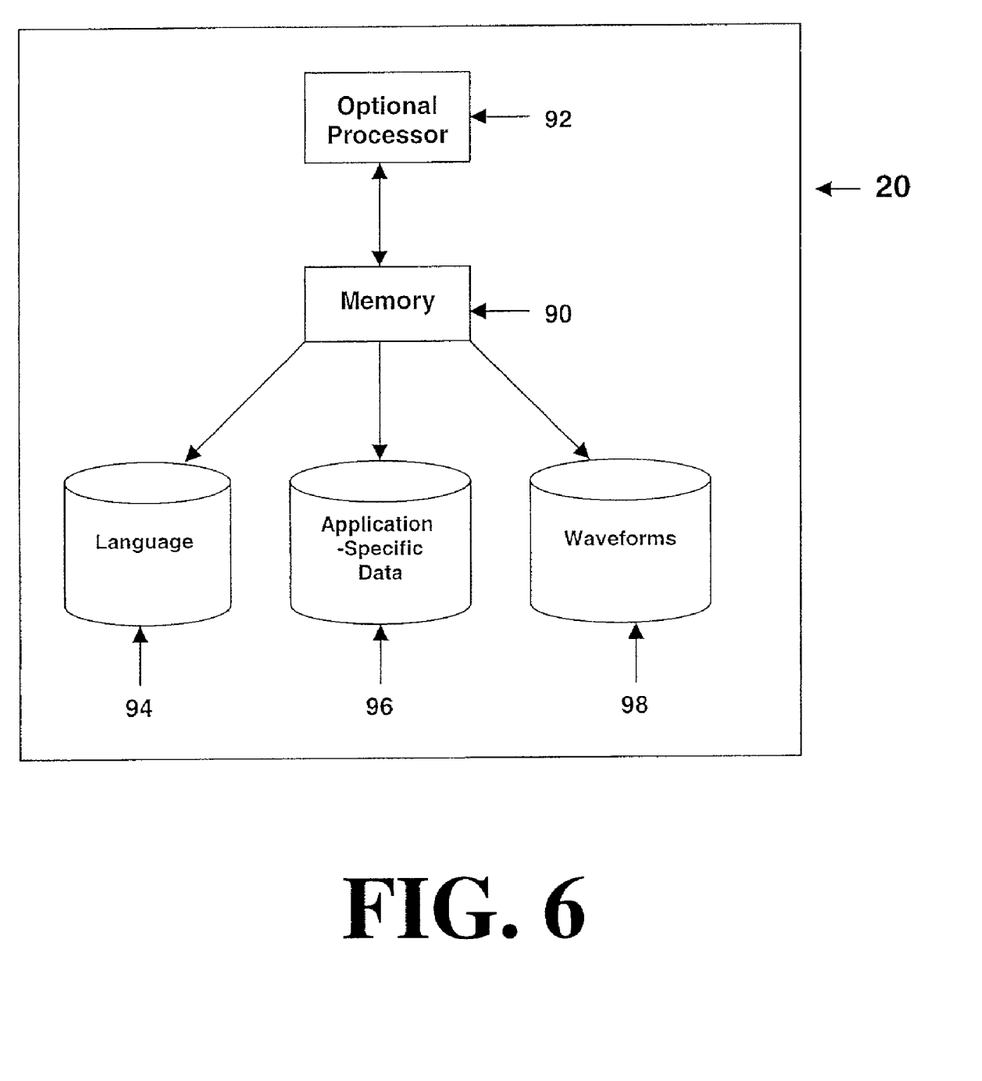
FIG. 6 is a block diagram that illustrates several hardware and software features of the an exemplary adapter module.

As noted above, and as illustrated in FIG. 6, the adapter module contains a carrier such as a computer memory 90 that stores computer program instructions. The program instructions direct the electronic device to operate as an oscilloscope. Optionally, the program instructions may be used to direct the operation of an optional processor 92 contained within the adapter module. Optionally, the adapter module memory also stores computer program instructions that direct the electronic device to provide other features, such as one or more printing device drivers, communications capability, software version updating features, calibration, and waveform storage. Preferably, the module memory also contains one or more databases such as language databases 94 that may be used to translate on-screen language to another language. In addition, for specific applications such as a vehicle engine analyzer, application-specific data 96 such as vehicle information (e.g., ignition and/or engine name, number of cylinders, ignition type, cylinder firing order, and/or cam/crank timing flag) may be provided. Databases of previously collected and/or model waveforms 98 are also optionally and preferably included. When such a waveform database 98 is included, the program instructions preferably include a capture buffer manager or other application to capture waveform information in a buffer such as a portion of the memory 90 for playback and/or storage. The capacity of the buffer may vary with the size of the memory provided with the adapter module.

The many features and advantages of the invention are apparent from the detailed specification, and thus, it is intended by the appended claims to cover all such features and advantages of the invention which fall within the true spirits and scope of the invention. Further, since numerous modifications and variations will readily occur to those skilled in the art, it is not desired to limit the invention to the exact construction and operation illustrated and described, and accordingly, all suitable modifications and equivalents may be resorted to, all of which may fall within the scope of the invention.

What is claimed is:

1. An oscilloscope adapter for a portable stand-alone electronic device, comprising:
a removable module adapted to mate with a port of the portable stand-alone electronic device for receiving the removable module, the removable module further adapted to interface with a hardware interface port of the portable stand-alone electronic device when the removable module is located in the port for receiving the removable module, the stand-alone electronic device having a processor and a display, the module including a computer program memory, the memory storing computer program instructions thereon to direct the processor to perform the steps of:
collecting data representative of a signal from an external source; and
displaying the data on the display as a waveform comprising individual data values as a function of time on a graph having a vertical axis and a horizontal axis, each axis having a scale.

2. The adapter of claim 1 wherein the adapter further includes a database of model waveforms, and the instructions further direct the processor to display a model waveform from the database on the display.

3. The adapter of claim 1 wherein the adapter further includes a database of collected waveform data, and the instructions further direct the processor to store the data representative of the signal in database of collected waveform data.

4. The adapter of claim 1 wherein the adapter or the portable stand-alone electronic device contains a buffer, and the instructions further direct the processor to store the data representative of the signal in the buffer.

5. The adapter of claim 1 wherein the instructions further direct the processor to provide an electronic device input that, when activated by a user, allows the user to adjust the scale of one or both of the vertical axis and the horizontal axis.

6. The adapter of claim 5 wherein the electronic device input that allows the user to adjust one or both scales is displayed on a setup screen.

7. The adapter of claim 1 wherein the adapter further includes a language database containing data representative of words in a plurality of languages.

8. A method of causing an electronic device to function as an oscilloscope, comprising:
providing a stand-alone electronic device having a processor, a display, a memory, a port for receiving a removable adapter module, and a hardware interface port;
connecting the removable adapter module to the hardware interface port by mating the removable adapter module to the receiving port;
delivering computer program instructions from the removable adapter module to the processor for the electronic device;
collecting data representative of a signal from an external source;
displaying, in response to the computer program instructions, the data on the display as a waveform comprising individual data values as a function of time on a graph having a vertical axis and a horizontal axis, each axis having a scale.

9. The method of claim 8 wherein the adapter further includes a database of model waveforms, and the method further includes selecting a model waveform from the database and displaying the selected model waveform on the display.

10. The method of claim 8 wherein the adapter further includes a database of collected waveform data, and the method further includes storing the data representative of the signal in the database of collected waveform data.

11. The method of claim 8 wherein the adapter or the portable stand-alone electronic device contains a buffer, and the method further includes storing the data representative of the signal in the buffer.

12. The method of claim 8 comprising the additional step of adjusting the scale of one or both of the vertical axis and the horizontal axis.

13. The method of claim 12 wherein the adjusting step is performed while a setup screen is displayed on the display.

14. The method of claim 8 wherein the adapter further includes a language database containing data representative of words in a plurality of languages, and the method comprises the additional steps of translating text and displaying the translated text on the display.

15. A system for causing an electronic device to function as an oscilloscope, comprising:
   means for processing electronic signals having a means for processing, a means for retaining memory, a means for receiving a removable adapter module, and a means for interfacing with the removable adapter module;
   means for retaining the removable adapter module to the receiving means to mate the removable adapter module to the interfacing means;
   means for delivering computer program instructions from the removable adapter module to the processing means for the means for processing electronic signals;
   means for collecting data representative of a signal from an external source; and
   means for displaying, in response to the computer program instructions, the data on the displaying means as a waveform comprising individual data values as a function of time on a graph having a vertical axis and a horizontal axis, each axis having a scale.

16. The system of claim 15 wherein the removable adapter module further includes a database of model waveforms.

17. The system of claim 16 wherein the computer program instructions further direct the processing means to display a model waveform from the database on the display means.

18. The system of claim 15 wherein the removable adapter module further includes a database of collected waveform data.

19. The system of claim 18 wherein the computer program instructions further direct the processing means to store the data representative of the signal in the database of collected waveform data.

20. The system of claim 15, wherein the means for processing electronic signals comprises:
   a portable stand-alone electronic device.

21. The system of claim 15, wherein the receiving means comprises:
   a port for receiving the removable adapter module.

22. The system of claim 15, wherein the retaining means comprises:
   one or more extensions.

23. The system of claim 22, wherein the extensions form grooves or notches.

* * * * *